United States Patent [19]
Blair

[11] Patent Number: 6,040,606
[45] Date of Patent: Mar. 21, 2000

[54] INTEGRATED CIRCUIT STRUCTURE WITH DUAL THICKNESS COBALT SILICIDE LAYERS AND METHOD FOR ITS MANUFACTURE

[75] Inventor: Christopher S. Blair, San Jose, Calif.

[73] Assignee: National Semiconductor Corporation, Santa Clara, Calif.

[21] Appl. No.: 09/187,306

[22] Filed: Nov. 4, 1998

[51] Int. Cl.[7] .......................... H01L 29/78; H01L 27/085; H01L 29/45
[52] U.S. Cl. ............................. 257/384; 257/413
[58] Field of Search ..................... 257/384, 413

[56] References Cited

U.S. PATENT DOCUMENTS

| | | | |
|---|---|---|---|
| 4,877,755 | 10/1989 | Rodder | 257/384 |
| 5,034,348 | 7/1991 | Hartswick et al. | 257/384 |
| 5,659,194 | 8/1997 | Iwamatsu et al. | 257/384 |
| 5,736,461 | 4/1998 | Berti et al. | 257/384 |
| 5,818,092 | 10/1998 | Bai et al. | 257/384 |
| 5,874,342 | 2/1999 | Tsai et al. | 257/384 |

OTHER PUBLICATIONS

Antonio C. Berti, et al., A Manufacturable Process for the Formation Of Self Aligned Cobalt Silicide in a Sub Micrometer CMOS Technology, VMIC Conference, Jun. 9–10, 1992, pp. 267–273.

Karen Maex, et al., Self–Aligned Silicides for ULSI, Material Research Society Symposium Proceedings, vol. 260, Apr. 27 –May 1, 1992, San Francisco, CA, pp. 133–144.

Stanley Wolf, et al., Silicon Processing for the VLSI ERA, Lattice Press, Sunset Beach, CA, 1986, pp. 388–399.

*Primary Examiner*—Gene M. Munson
*Attorney, Agent, or Firm*—Limbach & Limbach L.L.P.

[57] ABSTRACT

A process for the controlled formation of dual thickness cobalt silicide layers on predetermined regions during the manufacturing of an integrated circuit that requires a minimum number of steps and is compatible with standard MOS processing techniques. In the process according to the present invention, an integrated circuit (IC) structure is first provided. The IC structure includes a plurality of MOS transistor structures with exposed silicon surfaces, such as source regions, drain regions and polysilicon gates. A cobalt layer is then deposited over the IC structure, followed by the deposition of a titanium capping layer on the cobalt layer. The titanium capping layer is then pattered above predetermined regions of the IC structure. Cobalt in the cobalt layer that is in direct contact with silicon in the exposed silicon surfaces is subsequently reacted to form relatively thick cobalt silicide layers on the predetermined regions and relatively thin cobalt silicide layers elsewhere. The present invention also provides an IC structure with dual thickness cobalt silicide layers. The IC structure includes pluralities of first and second MOS transistor structures having source regions, drain regions and polysilicon gates. Relatively thin cobalt silicide layers are disposed on the first MOS transistor structures with shallow source and drain regions, while relatively thick cobalt silicide layers are disposed on the second MOS transistor structures with deep source and drain regions.

3 Claims, 6 Drawing Sheets

INTEGRATED CIRCUIT STRUCTURE WITH DUAL THICKNESS COBALT SILICIDE LAYERS AND METHOD FOR ITS MANUFACTURE

BACKGROUND OF THE INVENTION

1. Field of the Invention

The present invention relates to integrated circuits and processes for their manufacture and, in particular, to integrated circuits that include dual thickness cobalt silicide layers and methods for their manufacture.

2. Description of the Related Art

In Metal-Oxide-Semiconductor (MOS) device manufacturing, self-aligned metal silicide layers (also known as "salicide" layers) are useful in reducing the sheet resistance of polysilicon interconnections, source regions and drains regions, as well as contact resistance. See, for example, Stanley Wolf, *Silicon Processing for the VLSI Era*, Vol. I, 388–399 (Lattice Press, 1986).

FIGS. 1–3 illustrate a conventional process for forming a metal silicide layer over a polysilicon gate, a source region and a drain region of an MOS transistor structure within an integrated circuit (IC).

A conventional MOS transistor structure 10 includes a thin gate oxide layer 12 overlying P-type silicon substrate 14 between N-type drain region 16 and N-type source region 18, both of which are formed in P-type silicon substrate 14. A conventional MOS transistor structure 10 also includes a polysilicon gate 20 overlying thin gate oxide layer 12, as well as field oxide regions 22, which isolate MOS transistor structure 10 from neighboring semiconductor device structures (not shown). Gate sidewall spacers 24, typically formed of silicon dioxide or silicon nitride, are disposed on the lateral edges of polysilicon gate 20 and thin gate oxide layer 12.

In a conventional metal silicide formation process, a metal layer 28 is deposited over the surface of MOS transistor structure 10, as illustrated in FIG. 2. Metal layer 28 is ordinarily deposited by a multi-directional evaporative or sputtering-based physical vapor deposition (PVD) process or a multi-directional chemical vapor deposition (CVD) process and is, therefore, of essentially uniform thickness over the entire surface of MOS transistor structure 10.

Wherever metal layer 28 is in contact with silicon surfaces (i.e. source region 18, drain region 16 and the polysilicon surface of polysilicon gate 20) the metal is reacted to form a metal silicide layer. The reaction conditions, such as temperature and gaseous ambient, employed for the metal silicide layer formation are selected to foster the reaction of the metal layer with silicon surfaces while impeding reaction of the metal layer with silicon dioxide or silicon nitride surfaces (i.e. the gate sidewall spacers and field oxide regions).

A selective etch is then used to remove unreacted metal from the surface of the gate sidewall spacers and field oxide regions, as well as any unreacted metal residue still remaining above the source region, drain region and polysilicon gate. The etch is "selective" since it does not remove the metal silicide layer that was formed on the surface of the silicon and polysilicon regions. The result, illustrated in FIG. 3, is a metal silicide layer 32 on the surface of drain region 16, a metal silicide layer 34 on the surface of source region 18 and a metal silicide layer 36 on the surface of polysilicon gate 20.

The use of cobalt silicide layers is becoming increasingly common in semiconductor devices. During cobalt silicide layer formation it is often beneficial to utilize a bilayer system, which includes an initially deposited cobalt layer covered with a "capping" layer of titanium, titanium-tungsten (TiW), or titanium-nitride (TiN), prior to the reaction of the cobalt with silicon surfaces to form cobalt silicide layers. The use of capping layers is reported to improve device electrical parameters, to reduce cobalt overgrowth of oxide regions and, in the case of titanium capping layers, to provide a gettering mechanism that prevents cobalt oxidation during the silicide formation process. See, for example, Berti et al., U.S. Pat. No. 5,736,461; A. C. Berti and V. Bolkhovsky, *A Manufacturable Process for the Formation of Self Aligned Cobalt Silicide in a Sub Micrometer CMOS Technology*, VMIC Conference, June 9–10, 267–273 (1992); and K. Maex and R. Schreutelkamp, *Self-Aligned Silicides for ULSI*, Mat. Res. Soc. Symp. Proc., Vol. 260, 133–144 (1992), all of which are hereby incorporated by reference.

Conventional cobalt silicide processes can result in the formation of cobalt silicide layers on the source region, drain region and polysilicon gate regions of each MOS transistor structure within an IC that are all of essentially the same thickness. Since silicide layer thickness is, however, a critical factor in semiconductor device performance, it is often desirable to form cobalt silicide layers of different thicknesses on predetermined regions of a given semiconductor device or on predetermined semiconductor devices within a given IC in a controllable manner. For example, two separate semiconductor devices with different source and drain junction depths may be present in a single IC. In such a situation, the semiconductor devices with shallow source and drain junction depths may require a relatively thin cobalt silicide layer on those regions, in order to reduce the risk of junction spiking, while the semiconductor devices with deep junction depths still require a relatively thick cobalt silicide layer on those regions so as to reduce contact resistance.

U.S. Pat. No. 4,877,755 to Rodder describes a lengthy and complex dual thickness silicide process. This process relies on two separately applied silicide barrier layers that are intended to sequentially block metal silicide layer formation on the gate polysilicon and source and drain regions. Such a process is undesirable from the standpoint of both cost and processing time since it requires two metal silicide formation steps as well as two silicide barrier layer deposition steps. Furthermore, this process does not allow formation of silicide layers with varied thickness on individual areas within an IC, and thus only yields one essentially uniform thickness silicide on all polysilicon gates and another essentially uniform thickness silicide on all source and drain regions within an IC.

U.S. Pat. No. 5,034,348 to Hartswick et al. describes a dual thickness silicide process, which includes a step of applying a refractory metal layer (such as titanium) over the gate polysilicon layer prior to gate polysilicon patterning. In this process, following gate polysilicon patterning, the refractory metal layer is reacted with the gate polysilicon to form a first metal silicide layer on the gate polysilicon. A second metal silicide layer is subsequently formed over the source and drain regions. In addition to requiring two metal silicide formation steps, this process suffers from other limitations that render it unsuitable for use in conventional MOS processing. For example, the process makes it difficult to dope the polysilicon gate underneath the first metal silicide layer during conventional source and drain region formation processes, as well as to pattern the refractory metal/polysilicon multilayer gate structure to deep submicron dimensions. Furthermore, this process does not allow formation of silicide layers with varied thickness on individual areas within an IC, and thus only yields one essentially uniform thickness silicide on all polysilicon gates and another essentially uniform thickness silicide on all source and drain regions within an IC.

Still needed in the field is a process for the controlled formation of dual thickness cobalt silicide layers on an IC that requires a minimum number of steps, is compatible with standard MOS processing, and provides for the controlled formation of cobalt silicide layers of different thicknesses on individual predetermined polysilicon gates and/or source and drain regions within an IC. Also needed is an IC structure that includes cobalt silicide layers of varied thicknesses on predetermined polysilicon gates and/or source and drain regions.

SUMMARY OF THE INVENTION

The present invention provides a process for the formation of dual thickness cobalt silicide layers during integrated circuit (IC) manufacturing. The process requires a minimum number of steps, is compatible with standard MOS processing techniques and provides for the controlled formation of cobalt silicide layers of different thicknesses on predetermined regions (such as the source regions, drain regions or polysilicon gates) of an IC.

Processes according to the present invention include first providing an IC structure that includes a plurality of MOS transistor structures with exposed silicon surfaces (such as source regions, drain regions, and polysilicon gates). A cobalt layer is then deposited over the IC structure. A titanium capping layer is subsequently deposited on the cobalt layer. The titanium capping layer is then patterned, thereby reducing its thickness, above predetermined regions of the IC structure using, for example, photomasking and etching techniques. Cobalt in the cobalt layer that is in contact with exposed silicon surfaces is then reacted to form relatively thick cobalt silicide layers in the predetermined regions where the overlying titanium capping layer thickness was reduced, while forming relatively thin cobalt silicide layers elsewhere where the overlying titanium capping layer thickness was unaffected.

As is evident from the detailed description below, the key to the formation of dual thickness cobalt silicide layers (i.e. layers of two different thicknesses) in processes according to the present invention is the patterning (i.e. the reduction in thickness) of the titanium capping layer over predetermined regions. This selective reduction in titanium capping layer thickness results in the formation of relatively thick cobalt silicide layers below the region where the titanium capping layer was patterned and thus of reduced thickness. At the same time, relatively thin cobalt silicide layers are formed below the region where the titanium capping layer remained at its original thickness.

Also provided is an IC structure with dual thickness cobalt silicide layers. The inventive IC structure includes a first plurality of MOS transistor structures having source regions, drain regions and polysilicon gates, as well as a second plurality of MOS transistor structures also having source regions, drain regions and polysilicon gates. Relatively thin cobalt silicide layers are on the source regions, drain regions and polysilicon gates of the first plurality of MOS transistor structures while relatively thick cobalt silicide layers are on the source regions, drain regions and polysilicon gates of the second plurality of MOS transistor structures.

BRIEF DESCRIPTION OF THE DRAWINGS

A better understanding of the features and advantages of the present invention will be obtained by reference to the following detailed description that sets forth illustrative embodiments in which the principles of the invention are utilized, and the accompanying drawings of which.

DETAILED DESCRIPTION OF THE INVENTION

Figure 1:
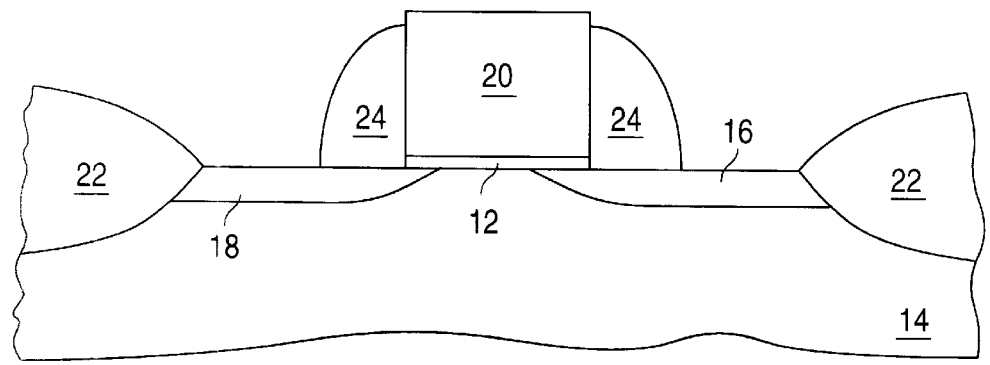
FIG. 1 is a cross-sectional view illustrating a conventional MOS transistor structure prior to the deposition of a metal layer.
Figure 2:
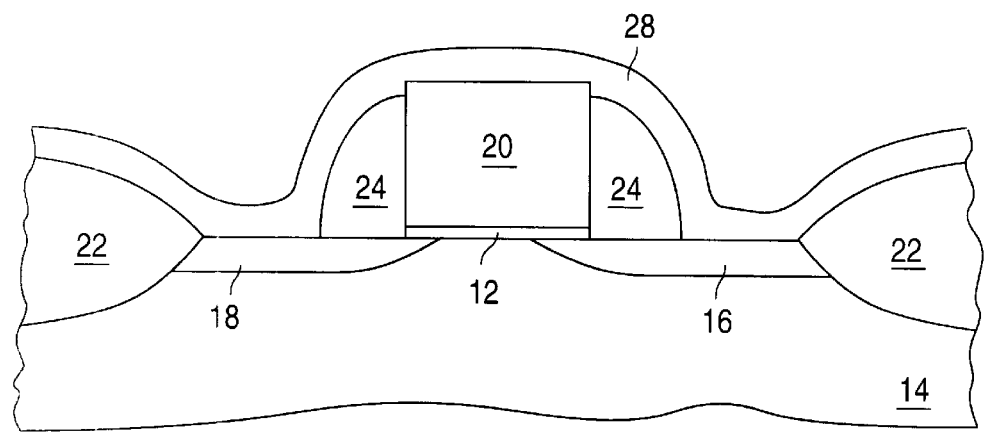
FIG. 2 is a cross-sectional view depicting a conventional MOS transistor structure after deposition of a metal layer.
Figure 3:
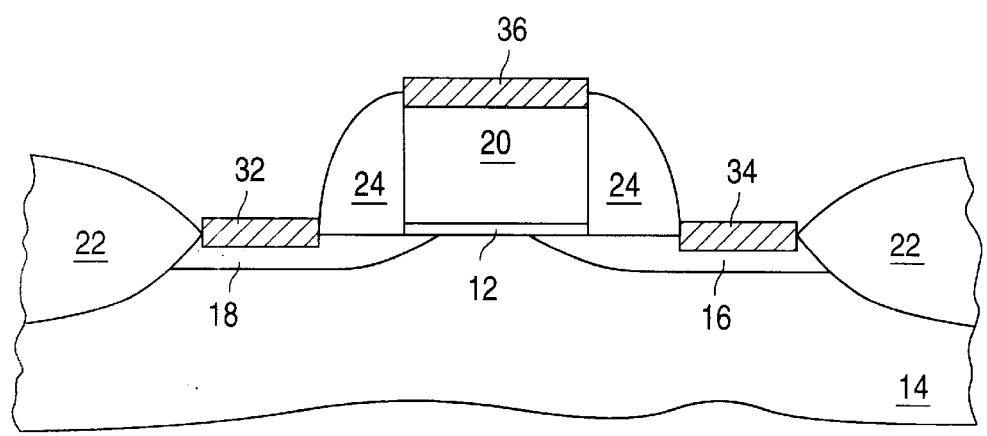
FIG. 3 is a cross-sectional view showing a conventional MOS transistor structure after reacting a metal layer with the silicon surfaces of the source and drain regions and the polysilicon surface of the polysilicon gate.
Figure 4:
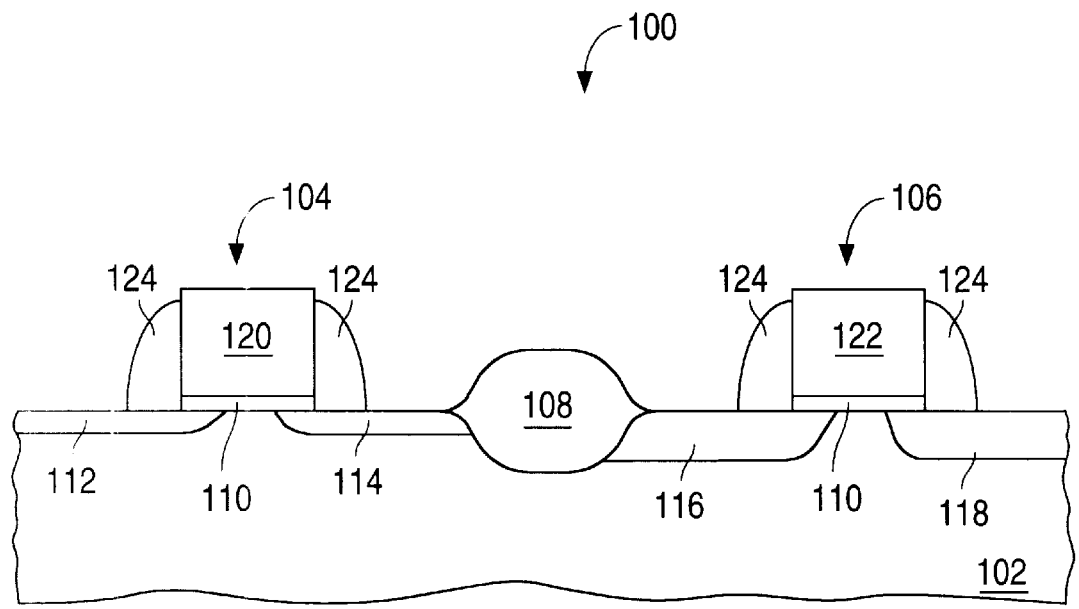
FIGS. 4–10 are cross-sectional views illustrating stages in one embodiment of a process in accordance with the present invention.

FIGS. 4–10 illustrate stages of a process for the formation of dual thickness cobalt silicide layers on an IC according to the present invention. An IC structure 100 with silicon substrate 102 of a first conductivity type, typically P-type, and a plurality of MOS transistor structures, such as MOS transistor structures 104 and 106 is initially provided as shown in FIG. 4. MOS transistor structures 104 and 106 are separated by field oxide region 108. Each MOS transistor structure includes a thin gate oxide layer 10 (typically less than 100 angstroms thick) overlying silicon substrate 102. The thin gate oxide layer 110 of MOS transistor structure 104 lies between shallow source region 112 and shallow drain region 114, both of which are formed in silicon substrate 102. The thin gate oxide layer 110 of MOS transistor structure 106 lies between deep source region 116 and deep drain region 118, both of which are also formed in silicon substrate 102. Polysilicon gates 120 and 122 (typical thickness being in the range between 2000 and 3000 angstroms) overly the thin gate oxide layer 110 of MOS transistor structures 104 and 106, respectively.

Each of MOS transistor structures 104 and 106 also includes gate sidewall spacers 124 which abut the lateral surfaces of the polysilicon gates 120 and 122 and thin gate oxide layers 110. These gate sidewall spacers are made, for example, of CVD silicon nitride or silicon dioxide and have a typical width in the range of 1000 to 1400 angstroms. MOS transistor structures 104 and 106 are separated from adjacent MOS transistor structures (not shown) by additional field oxide regions (also not shown).

If desired, the surface of IC structure 100 can be prepared for the subsequent deposition of a cobalt layer 126 (as described below) in a conventional manner, such as by the use of HF-based solutions to remove unwanted oxide layers covering the source regions, drain regions, or the polysilicon gates, thereby insuring the cobalt layer's direct contact with the underlying silicon.

Figure 5:
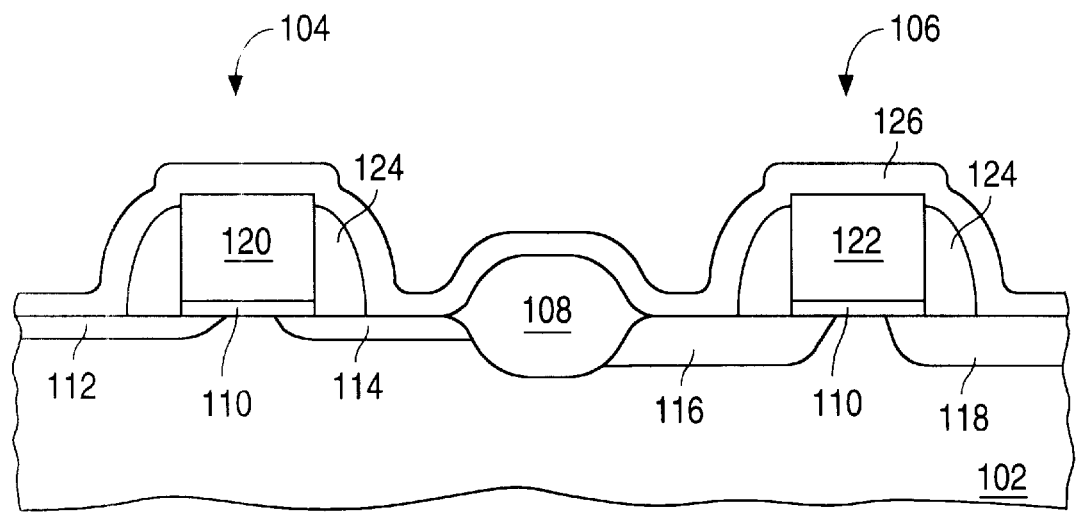

Next, cobalt layer 126 is deposited over the IC structure completely covering the shallow source region 112, shallow drain region 114, deep source region 116, deep drain region 118, polysilicon gates 120 and 122, field oxide region 108 and gate sidewall spacers 124. The resultant structure is illustrated in FIG. 5. The cobalt layer thickness is preferably in the range of 75 to 200 angstroms although thicker and thinner cobalt layers can be employed. Cobalt layer 126 can be deposited by any process known in the art, for example, sputtering or chemical vapor deposition.

Figure 6:
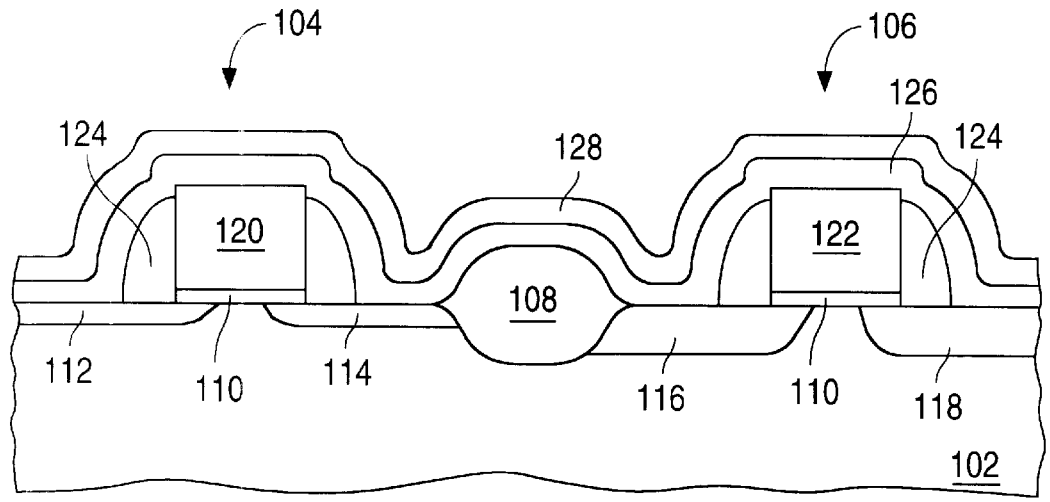
Figure 7:
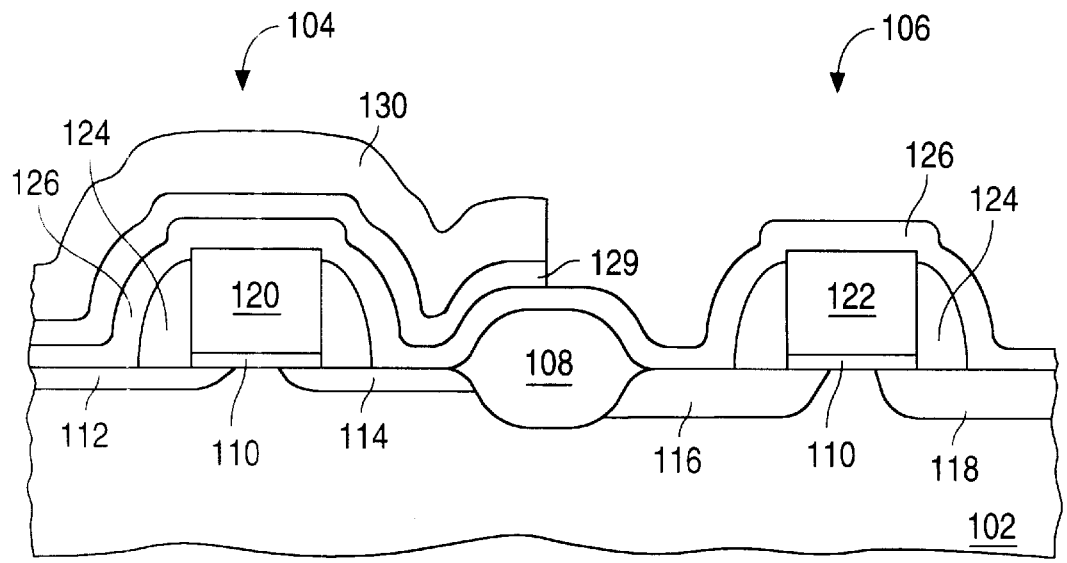
Figure 8:
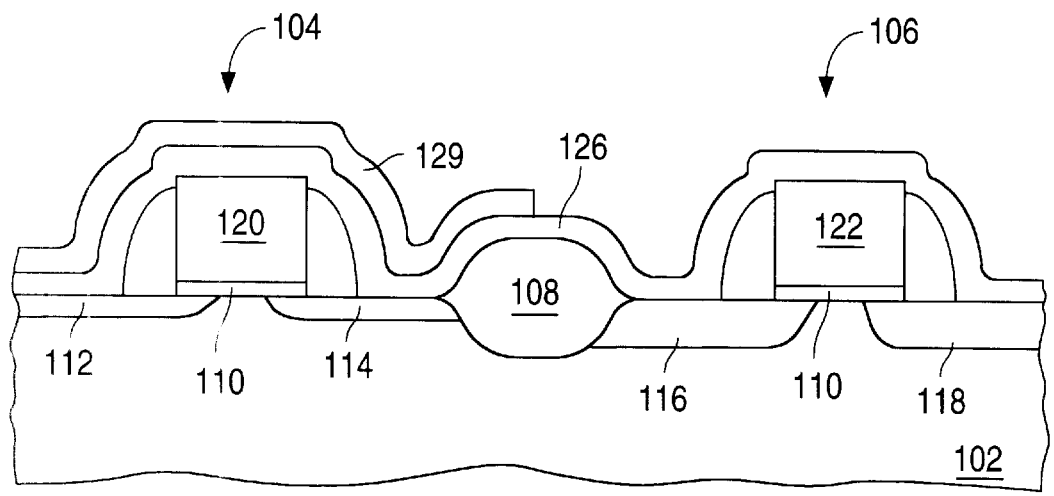
Figure 9:
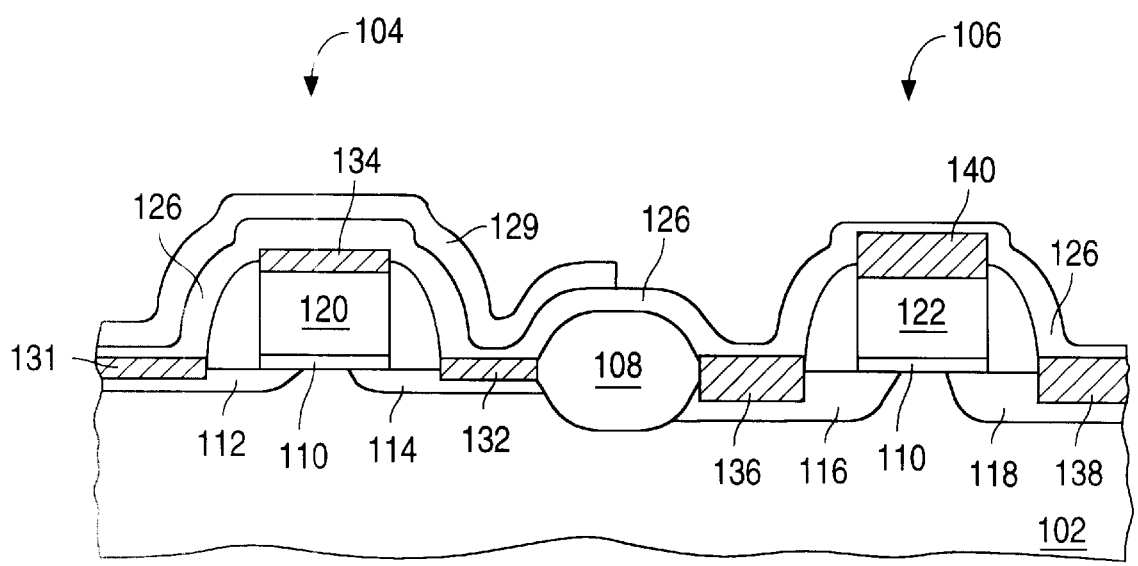
Figure 10:
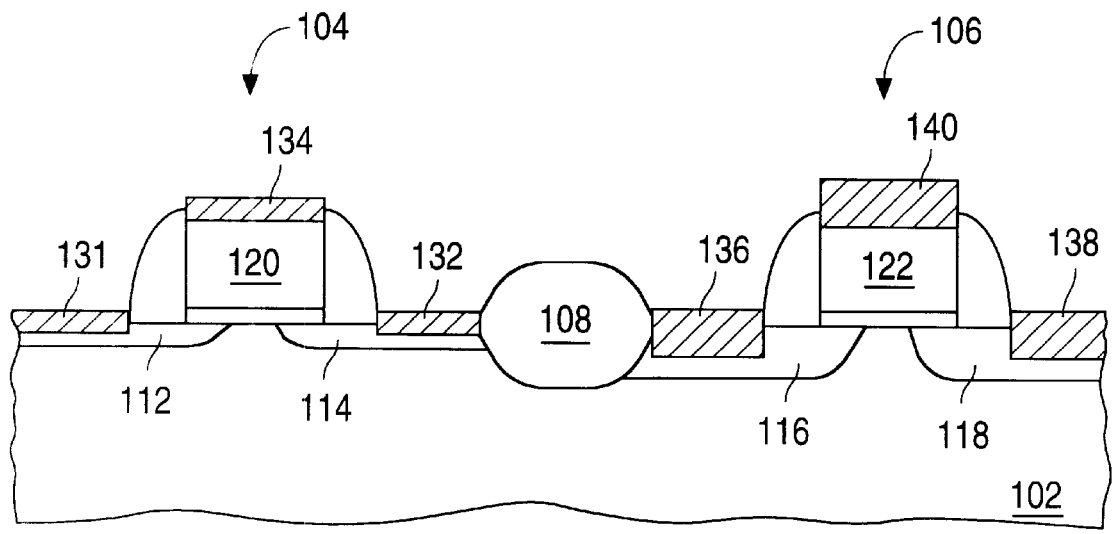

Next, a titanium capping layer 128 (typically 50 to 200 angstroms in thickness) is deposited over cobalt layer 126 using conventional sputtering techniques. The resulting structure is illustrated in FIG. 6. The titanium capping layer 128 is then patterned over predetermined regions of the IC structure to produce a patterned titanium capping layer 129, thereby reducing the thickness of the titanium capping layer 128 overlying the predetermined regions, as illustrated in FIG. 7. This patterning step can be accomplished using conventional patterned photomask and etching techniques (either plasma or wet based) known to those of skill in the art. The term "patterned" encompasses a complete reduction in thickness, in which the titanium capping layer thickness above the predetermined regions of the IC structure has been reduced to zero, i.e. the titanium capping layer has been completely eliminated above these regions (as illustrated in FIGS. 7 and 8 where the predetermined region is MOS transistor structure 106), as well as a partial reduction, in which the titanium capping layer thickness above the predetermined regions of the IC structure is somewhat reduced in thickness (not shown).

The patterning of titanium capping layer 128 can be accomplished, for example, using a patterned photoresist masking layer 130 (shown in FIG. 7) approximately 1.2 microns in thickness and a plasma etching process employing a Lam 9600 aluminum etcher, $Cl_2$ and $BCl_3$ gases, a pressure of 10 mTorr, 500 W of TCP power to the plasma, 220 W of power to the electrode, and a 60° C. wafer temperature. Cobalt will not be removed from the cobalt layer by such a plasma-based etch process since cobalt has no known volatile halides and will, therefore, not react with the plasma.

Next, the patterned photoresist masking layer 130 is removed and the IC structure cleaned using techniques known in the art, such as an $O_2$ based plasma ash followed by an EKC solvent clean. The resulting structure is shown in FIG. 8.

The motivation for patterning the titanium capping layer above the predetermined regions of the IC structure is based on the discovery that the thickness of cobalt silicide layers resulting from a reaction of cobalt in the cobalt layer with the directly underlying silicon is inversely related to the thickness of the titanium capping layer overlying that very cobalt layer. Table 1 below lists the sheet resistance data for cobalt silicide layers formed underneath of a titanium capping layer of various thicknesses, namely a 150 angstrom titanium (Ti) capping layer, a 75 angstrom Ti capping layer and a titanium nitride (TiN) capping layer in the absence of a Ti capping layer. All other factors were held constant in obtaining these data. The data in Table 1 demonstrate that the cobalt silicide layer thickness, which is inversely proportional to sheet resistance of the cobalt silicide layer itself, is a function of titanium capping layer thickness.

TABLE 1

| Ti Capping Layer Thickness | Cobalt Silicide Sheet Resistance |
|---|---|
| 150 Angstroms | 7.1 ohms/square |
| 75 Angstroms | 5.2 ohms/square |
| 0 Angstroms (with TiN cap) | 3.4 ohms/square |

The presence of a titanium capping layer overlying a cobalt layer prevents a portion of the cobalt layer from reacting with underlying silicon to form cobalt silicide. The result of this interaction between the titanium capping layer and the cobalt layer during cobalt silicide formation is the production of thinner cobalt silicide layers as the thickness of the titanium capping layer increases. The formation of cobalt silicide layers of two different thicknesses (i.e. dual thickness) in an IC structure according to the present invention takes advantage of this interaction.

It is believed that the "prevention effect" of a titanium capping layer on the formation of a cobalt silicide layer plateaus for titanium capping layers above 150 angstroms in thickness. Processes according to the present invention can, however, controllably form dual thickness cobalt silicide layers by patterning a titanium capping layer, and thereby reducing its thickness, over those predetermined regions (e.g. an MOS transistor structure with deep source and drain regions in a given IC structure or selected polysilicon gates in a given semiconductor device) where a thicker cobalt silicide layer is desired, while maintaining the titanium capping layer thickness substantially unaffected by the patterning process over the remaining regions (e.g. an MOS transistor structure with shallow source and drain regions in a given IC structure) where a thinner cobalt silicide layer is desired. For example, a thicker cobalt silicide layer may be desired over a MOS transistor structure with deep source and drain regions in a given IC structure for increasing its conductivity, while a thinner cobalt silicon layer may be desired over another MOS transistor structure with shallow source and drain regions for preventing junction spiking.

Next, cobalt in the cobalt layer 126 that is in direct contact with silicon in the shallow source region 112, shallow drain region 114, and polysilicon gate 120 is reacted to form first cobalt silicide (CoSi) layers 131, 132 and 134, respectively, on these regions. At the same time, cobalt in the cobalt layer 126 that is in direct contact with silicon in deep source region 116, deep drain region 118, and polysilicon gate 122 is reacted to form second cobalt silicide (CoSi) layers 136, 138 and 140, respectively, on these regions (see FIG. 9). Since the thickness of the patterned titanium capping layer 129 above the MOS transistor structure 106 was selectively reduced relative to its thickness above the MOS transistor structure 104, the resultant second cobalt silicide (CoSi) layers 136, 138 and 140 above the MOS transistor structure 106 are thicker than first cobalt silicide (CoSi) layers 131, 132 and 134 that are formed above the MOS transistor structure 104. By manipulating the relative thickness of the titanium capping layer above predetermined regions in a given IC structure versus its remaining regions, dual thickness cobalt silicide layers can be formed in a controllable manner.

The cobalt-silicon reaction can be conducted using procedures well known to those skilled in the art. Typical procedures employ elevated temperatures, around 450–550° C., in nitrogen for 30 seconds to 2 minutes, in order to foster the silicide formation and the reactions are normally conducted in a rapid thermal processor (RTP).

Next, the cobalt layer 126 (i.e. unreacted cobalt from the cobalt-silicon reaction that formed either a first or a second cobalt silicide layer) and the patterned titanium capping layer 129 are removed using a conventional selective wet etch, such as a mixture of sulfuric acid and hydrogen peroxide, or a mixture of phosphoric acid, acetic acid, nitric acid and hydrogen peroxide. The resultant structure, illustrated in FIG. 10, includes relatively thin cobalt silicide (CoSi) layers on the MOS transistor structure 104 and relatively thick cobalt silicide layers on the MOS transistor structure 104. A second thermal step is then used to convert the cobalt silicide (CoSi) layers to cobalt silicide ($CoSi_2$)

layers. This second thermal step can be conducted in an RTP at 650–850° C. for 30 seconds to 2 minutes in an $N_2$ ambient.

Processes according to the present invention can form dual thickness cobalt silicide layers where the second cobalt silicide layers are up to two or more times greater in thickness than the first cobalt silicide layers. The typical thickness range for the relatively thin first cobalt silicide ($CoSi_2$) layers is from 100 to 400 angstroms, while the relatively thick second cobalt silicide ($CoSi_2$) layer is from greater than 100 to 800 angstroms.

Figure 11:
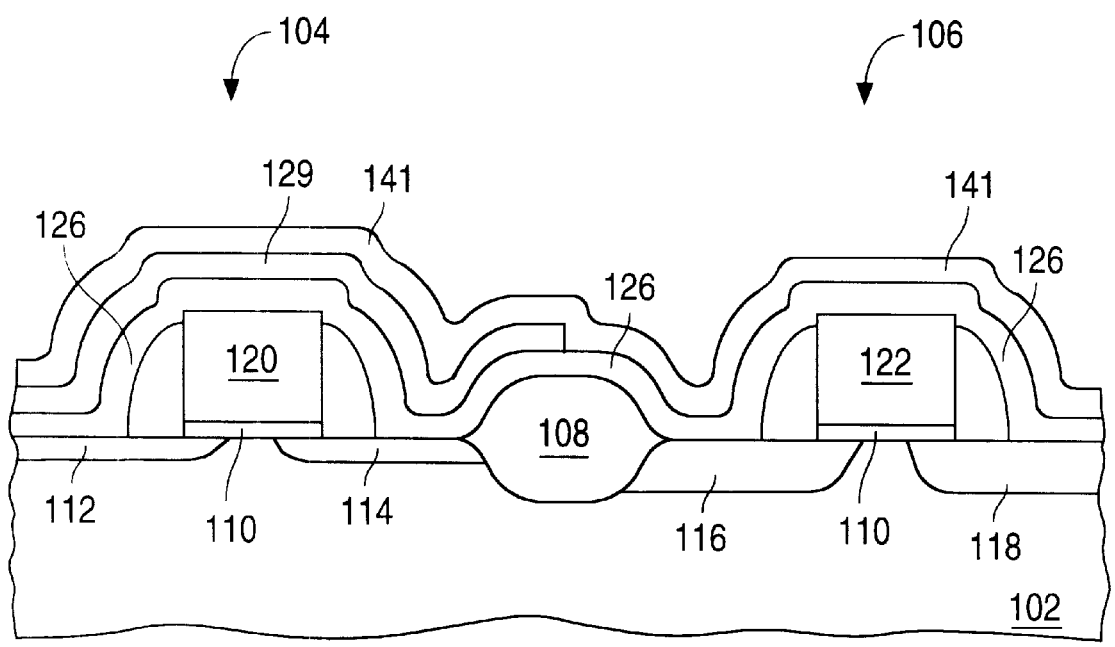
FIGS. 11–12 are cross-sectional views illustrating stages in another embodiment of a process in accordance with the present invention.

In one embodiment of a process according to the present invention, following the step of selectively patterning the titanium capping layer over predetermined regions in a given IC structure, a titanium-nitride (TiN) capping layer 141 is deposited over the IC structure, as illustrated in FIG. 11. The patterned titanium capping layer 129 is capable of gettering oxygen during the silicide formation process, and thus preventing undesirable cobalt layer oxidation, by isolating the cobalt layer from oxygen that may be in the processing environment. This appears to be true even if the patterned titanium capping layer has been completely removed during the selective patterning step from above the MOS transistor structure 106, since the presence of the patterned titanium capping layer above the MOS transistor structure 104 provides a sufficient "oxygen gettering" mechanism for the entire IC structure. The presence of a TiN capping layer 141 provides additional assurance by further isolating the cobalt layer from oxygen that may be in the processing environment. The TiN capping layer is not known to have any adverse interactions with cobalt as far as the formation of cobalt silicide layers is concerned. The TiN capping layer can be deposited by sputtering or CVD and has a typical thickness of around 200 angstroms.

Figure 12:
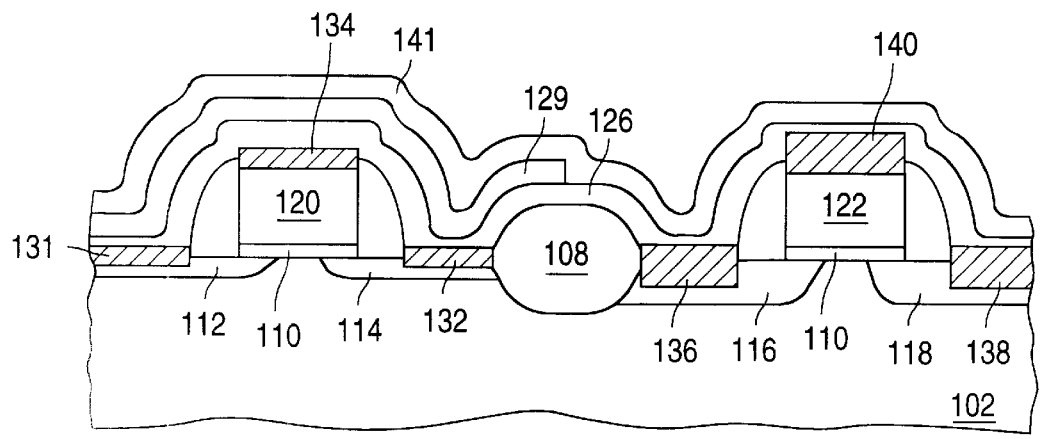
Figure 13:
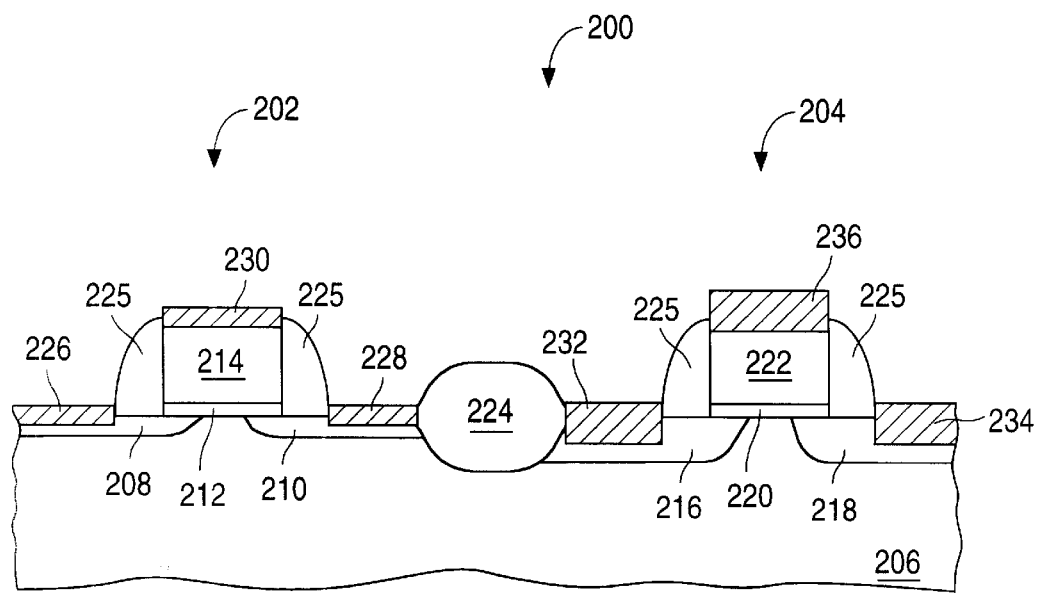
FIG. 13 is a cross-sectional view illustrating an IC with dual thickness cobalt silicide layers in accordance with the present invention.

Next, as described above with respect to the embodiment illustrated in FIGS. 4–10, cobalt in cobalt layer 126 that is in direct contact with silicon in the shallow source region 112, shallow drain regions 114, and polysilicon gate 120 is reacted to form first cobalt silicide (CoSi) layers 131, 132 and 134, respectively, on these regions. At the same time, cobalt in the cobalt layer 126 that is in direct contact with silicon in the deep source region 116, deep drain region 118, and polysilicon gate 122 is reacted to form second cobalt silicide (CoSi) layers 136, 138 and 140, respectively, on these regions (see FIG. 12). The cobalt layer 126 (i.e. unreacted cobalt from the cobalt-silicon reaction that formed either a first or a second cobalt silicide layer), the patterned titanium capping layer 129 and the TiN capping layer 141 are removed using a conventional selective wet etch, such as a mixture of sulfuric acid and hydrogen peroxide, or a mixture of phosphoric acid, acetic acid, nitric acid and hydrogen peroxide. The resultant structure, equivalent to that illustrated in FIG. 10, includes a relatively thin cobalt silicide (CoSi) layer on the MOS transistor structure 104 and a relatively thick cobalt silicide (CoSi) layer on the MOS transistor structure 106. A second thermal step, similar to the one described above, is subsequently performed to convert the cobalt silicide (CoSi) layers to cobalt silicide ($CoSi_2$) layers.

Also provided by the present invention is an IC structure with cobalt silicide layers of different thicknesses (i.e. dual thickness cobalt silicide layers) on predetermined polysilicon gates and/or source and drain regions. IC structure 200 includes first MOS transistor structure 202 and second MOS transistor structure 204 in semiconductor substrate 206. First MOS transistor structure 202 includes shallow source region 208, shallow drain region 210, thin gate oxide layer 212, polysilicon gate 214 and gate sidewall spacers 225, while second MOS transistor structure 204 includes deep source region 216, deep drain region 218, thin gate oxide layer 220, polysilicon gate 222, and gate sidewall spacers 225. The first and second MOS transistor structures 202 and 204 are separated by a field oxide region 224. Shallow source region 208, shallow drain region 210 and polysilicon gate 214 of the first MOS transistor structure 202 respectively have first cobalt silicide ($CoSi_2$) layers 226, 228, and 230 on their surfaces, while deep source region 216, deep drain region 218 and polysilicon gate 222 of the second MOS structure respectively have second cobalt silicide ($CoSi_2$) layers 232, 234, and 236 on their surfaces. The second cobalt silicide ($CoSi_2$) layers 232, 234 and 236 are one-and-a-half to two or more times thicker than the first cobalt silicide ($CoSi_2$) layers 226, 228, and 230. Such dual thickness cobalt silicide layer IC structures according to the present invention are capable of preventing undesirable junction spiking by providing relatively thin cobalt silicide layers on MOS transistor structures with shallow source and drain regions, while simultaneously providing appropriately scaled (i.e. relatively thick) cobalt silicide layers on MOS structures with deep source and drain regions, within a given IC structure. A typical thickness range for the first (i.e. relatively thin) cobalt silicide layers is from 100 to 400 angstroms, while the second (relatively thick) cobalt silicide layers is from greater than 100 to 800 angstroms.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An IC structure with dual thickness cobalt silicide layers, the IC structure comprising:

a plurality of first MOS transistor structures with shallow source and drain regions and polysilicon gates;

a plurality of second MOS transistor structures with deep source and drain regions and polysilicon gates;

thin cobalt silicide ($CoSi_2$) layers on the first MOS transistor structures; and thick cobalt silicide ($CoSi_2$) layers on the second MOS transistor structures.

2. The IC structure of claim 1, wherein the thickness of the thin cobalt silicide ($CoSi_2$) layers is in the range of 100 to 400 angstroms and the thickness of the thick cobalt silicide ($CoSi_2$) layers is in the range of greater than 100 to 800 angstroms.

3. The IC structure of claim 2, wherein the thick cobalt silicide ($CoSi_2$) layers are 1.5 to 2.0 times thicker than the thin cobalt silicide ($CoSi_2$) layers.

* * * * *